(12) United States Patent
Veeder et al.

(10) Patent No.: US 10,594,299 B1
(45) Date of Patent: Mar. 17, 2020

(54) DYNAMIC RESISTANCE ELEMENT ANALOG COUNTER

(71) Applicant: Senseeker Engineering Inc., Goleta, CA (US)

(72) Inventors: Kenton Veeder, Santa Barbara, CA (US); Aaron Bluestone, Goleta, CA (US); Christoph von Jutrzenka Trzebiatowski, Goleta, CA (US); Nishant Dhawan, Santa Barbara, CA (US)

(73) Assignee: SENSEEKER ENGINEERING, INC., Santa Barbara, CA (US)

( * ) Notice: Subject to any disclaimer, the term of this patent is extended or adjusted under 35 U.S.C. 154(b) by 0 days.

(21) Appl. No.: 15/951,196

(22) Filed: Apr. 12, 2018

Related U.S. Application Data

(60) Provisional application No. 62/484,861, filed on Apr. 12, 2017.

(51) Int. Cl.
    *H03H 11/26* (2006.01)
    *H04N 5/378* (2011.01)
    *H03K 25/00* (2006.01)

(52) U.S. Cl.
    CPC ........... *H03H 11/265* (2013.01); *H03K 25/00* (2013.01); *H04N 5/378* (2013.01)

(58) Field of Classification Search
    CPC ....... H03K 25/02; H03K 25/04; H03H 11/265
    USPC ............................... 327/126; 377/60–63, 95
    See application file for complete search history.

(56) References Cited

U.S. PATENT DOCUMENTS

| | | | | |
|---|---|---|---|---|
| 3,150,271 A | * | 9/1964 | Robertson | H03K 4/023 327/128 |
| 3,706,890 A | * | 12/1972 | Clements | H03K 25/00 327/126 |
| 7,615,753 B2 | * | 11/2009 | Audebert | G01T 1/17 250/370.07 |
| 9,628,105 B1 | * | 4/2017 | Veeder | H03M 3/39 |
| 10,136,083 B1 | * | 11/2018 | Veeder | H03M 3/39 |

OTHER PUBLICATIONS

J. Starzyk and L. Jing, "Analog circuits for self-organizing neural networks based on mutual information" in Proc. 33rd Southeastern Symp. Syst. Theory, Mar. 18-20, 2001, pp. 89-94.
E. Panina, L. Pancheri, et al., "Compact CMOS Analog Counter for SPAD Pixel Arrays" IEEE Transactions on Circuits and Systems—II: Express Briefs, vol. 61, No. 4, Apr. 2014, pp. 214-218.

(Continued)

*Primary Examiner* — Lincoln D Donovan
*Assistant Examiner* — Colleen J O Toole
(74) *Attorney, Agent, or Firm* — Hsuanyeh Law Group, PC

(57) ABSTRACT

The present disclosure provides an analog counter circuit for use in a minimal-sized circuitry. The analog counter circuit of the present disclosure can provide much higher resolution versus power consumption and layout area as compared to conventional digital counters. The analog counter circuit of the present disclosure can also provide much better bias supply management, step accuracy, multi-element step uniformity and lower supply spiking as compared to conventional analog counter architectures. The compact size of the disclosed counter circuit allows better integration of arrayed elements, such as, an array of image sensing pixels or an array of artificial neurons.

18 Claims, 5 Drawing Sheets

(56) References Cited

OTHER PUBLICATIONS

L. Pancheri, N. Massari, et al., "SPAD Image Sensor With Analog Counting Pixel for Time-Resolved Fluorescence Detection" IEEE Transactions on Electron Devices, vol. 60, No. 10, Oct. 2013, pp. 3442-3448.

K. Madani, P. Garda, et al., Two Analog Counters for Neural Network Implementation IEEE Journal of Solid-State Circuits, vol. 26, No. 7, Jul. 1991, pp. 966-974.

M. Perenzoni, N. Massari, et al., "A 160×120 Pixel Analog-Counting Single-Photon Imager With Time-Gating and Self-Referenced Column-Parallel A/D Conversion for Fluorescence Lifetime Imaging" IEEE Journal of Solid-State Circuits, vol. 51, No. 1, Jan. 2016. pp. 155-167.

* cited by examiner

DYNAMIC RESISTANCE ELEMENT ANALOG COUNTER

RELATED APPLICATIONS

The present disclosure claims the benefit of priority to U.S. Provisional Application No. 62/484,861, filed on Apr. 12, 2017, the entire contents of which are incorporated herein by reference for all purposes.

Additionally, the present disclosure relates to U.S. patent application Ser. No. 14/873,886, filed on Oct. 2, 2015, issued as U.S. Pat. No. 9,628,105 on Apr. 18, 2017, the entire contents of which are incorporated herein by reference for all purposes.

STATEMENT REGARDING GOVERNMENT SPONSORED RESEARCH OR DEVELOPMENT

This invention was made with U.S. Government support under contract number HQ0147-16-C-7036, awarded by the U.S. Missile Defense Agency through its SBIR program (MDA15-019). The U.S. Government has certain rights in this invention.

TECHNICAL FIELD

The present disclosure relates to counting mechanisms for integrated circuits. More particularly, the present disclosure relates to small pitch arrayed numerical processing common in image sensors, analog computers, and/or artificial neural networks.

BACKGROUND

Parallel systems such as artificial neural networks or pixel arrays often rely on localized mathematical operations performed in distributed unit cells in one, two, or three-dimensional arrays. One fundamental mathematical element necessary to many mathematical operations is the counter element. Counters are used to accumulate input signals, apply multiplication factors, integrate over time and generally assist in many types of temporal operations. It is advantageous for these computations and the subsequent results to be self-contained in the unit cell to reduce information transfer, thereby increasing the speed and reducing the power necessary to complete each operation. One example of an image sensing application making use of small area counters is arrayed digital pixel sensors. These sensors often rely on very small signal accumulators made out of count elements to store the integrated signal captured within a scene. In digital pixel sensors, an analog input to the unit cell is converted to a digital word that can be manipulated and stored via digital gates and flip-flops. See, e.g., B. Fowler, et al., "A CMOS Area Image Sensor With Pixel Level A/D Conversion," IEEE Int'l Solid-State Circuits Conference, pp. 226-227 (1994).

There are multiple ways to make an analog counter. The most straight forward way is to pulse a current source for a set amount of time so as to deposit charge on a capacitor for each pulse. See, e.g., K. Madani, et al., "Two analog counters for neural network implementation," IEEE J. Solid-State Cir., vol. 26, no. 7, pp. 966-974 (July 1991). The final voltage left on the capacitor will be linearly proportional to the number of pulses or counts. The problem with this scheme is that the charge packet deposited on the capacitor each time is a function of both the current magnitude as well as the pulse width. This reduces the maximum resolution of an analog counter by increasing the noise floor and generally makes this architecture less robust. This method is also prone to signal-dependent resistive drop cross-talk across large arrays of elements, thereby further degrading the achievable count.

Other methods rely on precision charge transfer mechanisms. This typically requires a precision voltage supply to set a voltage across a charge transfer capacitor, which has some of the same speed and supply management issues for large arrays as in conventional digital pixel architectures.

Prior work has shown that capacitors can serve as analog storage devices with reduced power and area compared to their digital counterparts. See, e.g., D. Stoppa, et al., "A 32×32-Pixel Array with In-Pixel Photon Counting and Arrival Time Measurement in the Analog Domain," IEEE European Solid-State Device Conference, pp. 204-207 (2009). Unfortunately, logarithmic behavior and non-binary weighting inherently reduce the noise margin for interpreting the stored values. Further, chip-wide mismatch and charge transfer nonlinearity amplify the complexity while reading out an array of analog stored values. Cascaded analog counters have been shown to alleviate the noise margin constraint by storing the data on several rank-weighted capacitors. See, e.g., A. Peizerat, et al., "An analog counter architecture for pixel-level ADC," Proc. of 2009 Int'l Image Sensor Workshop, Bergen, NORWAY (Jun. 22-28, 2009). While previous efforts have presented charge-packet transfer techniques for fixed analog step sizes, there is a need to develop a novel architecture that exhibits improved step size linearity and uniformity across the array as well as improved bias management for large arrays.

SUMMARY

The present disclosure provides an analog counter circuit for use in a minimal-sized circuitry. The analog counter circuit of the present disclosure can provide much higher resolution versus power consumption and layout area as compared to conventional digital counters. The analog counter circuit of the present disclosure can also provide much better bias supply management, step accuracy, multi-element step uniformity and lower supply spiking as compared to conventional analog counter architectures. The compact size of the disclosed counter circuit allows better integration of arrayed elements, such as, an array of image sensing pixels or an array of artificial neurons.

The present disclosure additionally provides a mechanism to transfer a fixed packet of charge off a capacitor using an electrical circuit element which dynamically changes resistance. Upon the beginning of the charge transfer, the dynamic resistance element (DRE) has very low resistance and charges can freely transfer through the DRE at a high rate. As the voltage across the DRE changes and reaches a pre-determined state, the resistance of the DRE increases rapidly to the point where charge transfer is effectively eliminated regardless of the voltage drop across the DRE. This mechanism can replace the pulsed current or charge packet transfer approaches of the prior art. The magnitude of transferred charge is a function of the size of the built-in low resistance region of the DRE which can be made programmable. The DRE analog counter is also fully compatible with cascade operation which is used to reduce the likelihood of errors in the final count and keep the final counts noiseless. Moreover, the DRE analog counter can tolerate much lower power consumption and higher non-uniformity in the internal devices, thereby allowing the DRE analog counter circuitry to be integrated into a much smaller area and arrayed into thousands or millions of elements.

In accordance with one aspect, the present disclosure provides an analog counter, comprising: a dynamic resistance element having a first terminal and a second terminal electrically coupled to an output terminal, the dynamic resistance element having a variable resistance; an input switch electrically coupled to the first terminal of the dynamic resistance element, the input switch being configured to receive an input signal; a first capacitor electrically coupled to the input switch through a first node and between a supply voltage and the first node; a charge transfer switch electrically coupled between the first node and the supply voltage; a second capacitor electrically coupled between the supply voltage and the output terminal; and a reset switch electrically coupled between the second terminal of the dynamic resistance element and a ground.

In accordance with another aspect, the present disclosure provides a readout circuit for processing input signals from an array of image sensing pixels, the readout circuit comprising the analog counter described above.

In accordance with still another aspect, the present disclosure provides a multi-stage analog counter, comprising: a first stage analog counter comprising a first switch and a first reset switch; a second stage analog counter comprising a second input switch; and a comparator configured to compare a first output voltage of the first stage analog counter with a reference voltage; wherein, when the first output voltage reaches the reference voltage, the comparator is configured to generate a second output voltage to turn on the first reset switch and the second input switch, and to turn off the first input switch, such that the second stage analog counter increments by one count and the first stage analog counter is reset.

In accordance with one aspect, the present disclosure provides an analog counter, comprising: a dynamic resistance element having a first terminal and a second terminal electrically coupled to an output terminal, the dynamic resistance element having a variable resistance; an input switch electrically coupled to the first terminal of the dynamic resistance element, the input switch being configured to receive an input signal; a first capacitor electrically coupled to the input switch through a first node and between a supply voltage and the first node; a charge transfer switch electrically coupled between the first node and the supply voltage; a second capacitor electrically coupled between the supply voltage and the output terminal; and a reset switch electrically coupled between the second terminal of the dynamic resistance element and a ground.

In one embodiment, the variable resistance changes in accordance with a voltage difference across the supply voltage and the first terminal. The dynamic resistance element comprises a regulated cascode, which comprises a first transistor, a second transistor, and a third transistor, wherein a source of the first transistor is electrically coupled to a drain of the second transistor and a gate of the third transistor, and wherein a gate of the second transistor is electrically coupled to a source of the third transistor. A conductive range of the dynamic resistance element is determined in accordance with a voltage applied to a gate of the first transistor. A drain of the third transistor is electrically coupled to the output terminal. A source of the second transistor is electrically coupled to the supply voltage. At least one of the first and second capacitors is a parasitic capacitor.

In accordance with another aspect, the present disclosure provides a readout circuit for processing input signals from an array of image sensing pixels, the readout circuit comprising the analog counter described above.

In accordance with still another aspect, the present disclosure provides a multi-stage analog counter, comprising: a first stage analog counter comprising a first dynamic resistance element, a first switch coupled to a first terminal of the first dynamic resistance element, and a first reset switch coupled between a second terminal of the first dynamic resistance element and a ground, the second terminal being coupled to a first output terminal; a second stage analog counter comprising a second dynamic resistance element and a second switch coupled to a first terminal of the second dynamic resistance element, wherein a second terminal of the second dynamic resistance element is coupled to a second output terminal; and a comparator configured to compare a first output voltage of the first stage analog counter with a reference voltage; wherein, when the first output voltage reaches the reference voltage, the comparator is configured to generate a second output voltage to turn on the first reset switch and the second switch, and to turn off the first switch, such that the second stage analog counter increments by one count and the first stage analog counter is reset.

In one embodiment, the first stage analog counter further comprises: a first input switch electrically coupled to the first switch, the first input switch being configured to receive an input signal; a first capacitor electrically coupled to the input switch through a first node and between a supply voltage and the first node; a charge transfer switch electrically coupled between the first node and the supply voltage; a second capacitor electrically coupled between the supply voltage and the first output terminal; and a first stage reset switch electrically coupled between the second terminal of the dynamic resistance element and a ground. The first dynamic resistance element has a variable resistance that changes in accordance with a voltage difference across the supply voltage and the first terminal of the first dynamic resistance element.

In one embodiment, the second stage analog counter further comprises: a second input switch electrically coupled to the second switch, the second input switch being configured to receive an input signal; a third capacitor electrically coupled to the second input switch through a third node and between a supply voltage and the third node; a charge transfer switch electrically coupled between the third node and the supply voltage; a fourth capacitor electrically coupled between the supply voltage and the second output terminal; and a second stage reset switch electrically coupled between the second terminal of the dynamic resistance element and a ground. The second dynamic resistance element has a variable resistance that changes in accordance with a voltage difference across the supply voltage and the first terminal of the second dynamic resistance element.

In accordance with yet another aspect, the present disclosure provides a readout circuit for processing input signals from an array of image sensing pixels, the readout circuit comprising the multi-stage analog counter as described above.

DETAILED DESCRIPTION

Figure 1:
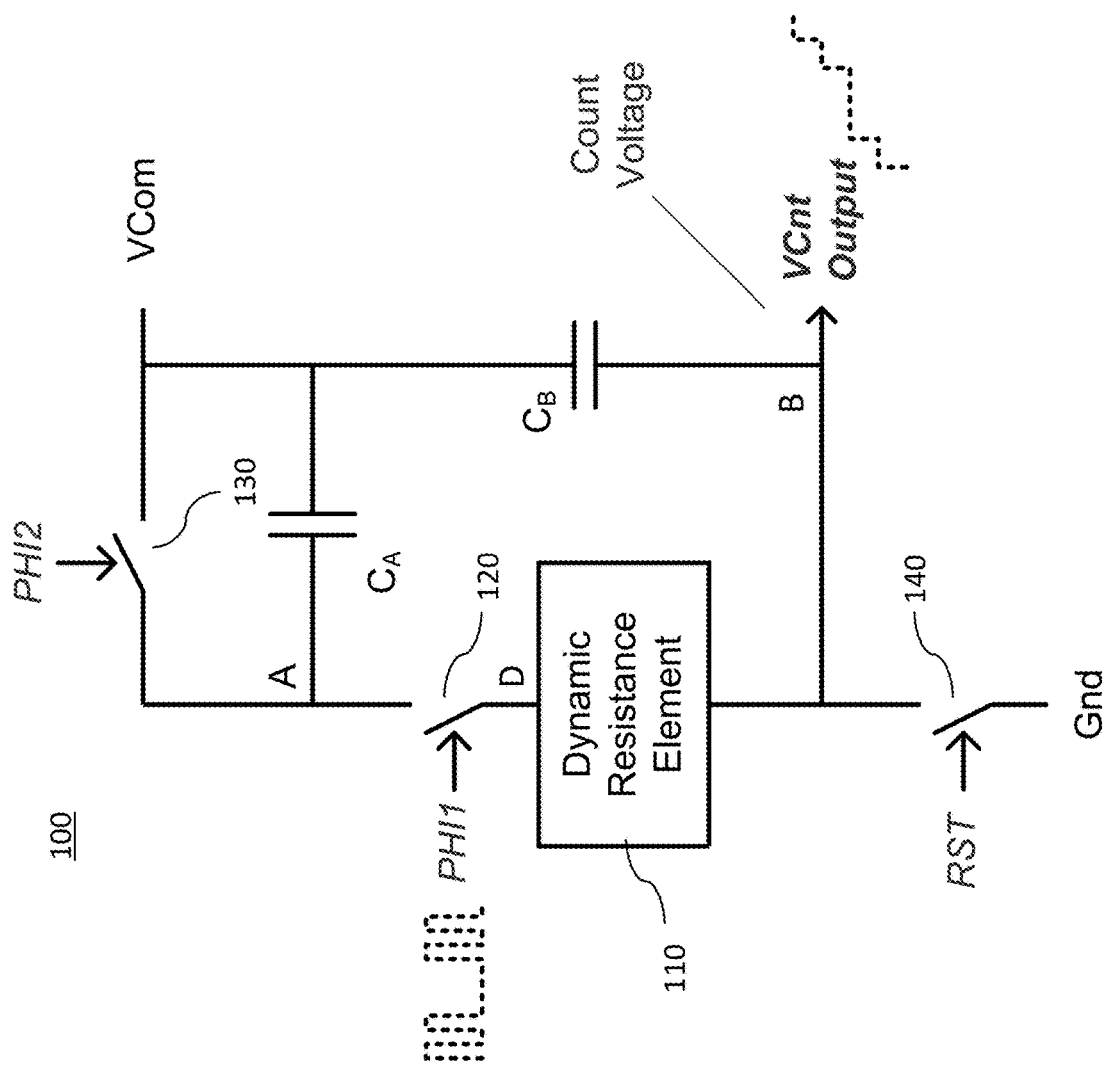
FIG. 1 illustrates an analog counter using a Dynamic Resistance Element (DRE), in accordance with an embodiment of the present disclosure.

FIG. 1 illustrates a compact analog counter using a Dynamic Resistance Element (DRE), in accordance with an embodiment of the present disclosure. As shown in FIG. 1, a charge transferring dynamic resistance element (DRE) and a counter architecture based upon the DRE are used in place of a conventional charge packet source or current source and clock.

Referring to FIG. 1, a DRE Analog Counter (DREAC) 100 comprises: a DRE 110 having a first terminal at node D and a second terminal electrically coupled to an output terminal at node B; an input switch 120 electrically coupled to the first terminal of the dynamic resistance element 110, input switch 120 being configured to receive an input signal PHI1; a charge transfer capacitor CA electrically coupled to input switch 120 through node A and between a supply voltage VCom and node A; a charge transfer switch 130 electrically coupled between node A and supply voltage VCom; a counting capacitor CB electrically coupled between supply voltage VCom and the output terminal at node B; and a reset switch 140 electrically coupled between the second terminal of DRE 110 and the ground. DRE 110 is connected in series with input switch 120 driven by input signal PHI1 and separating charge transfer capacitor CA and a counting capacitor CB.

This charge transfer can be positive or negative for count-up or count-down, respectively. The amount of charge transferred is set by the capacitance of capacitor CA multiplied by the conductive voltage range of the DRE 110. The counter resolution may be set by the capacitance of capacitor CB and the charge transferred from capacitor CA. Generally, a smaller capacitance ratio of capacitors CA and CB (CA/CB) translates to a larger counter resolution. It is appreciated that, in certain embodiments, capacitors CA and/or CB may be a parasitic capacitor existing in DREAC 100 and does not have to be a physically placed capacitor.

Figure 2:
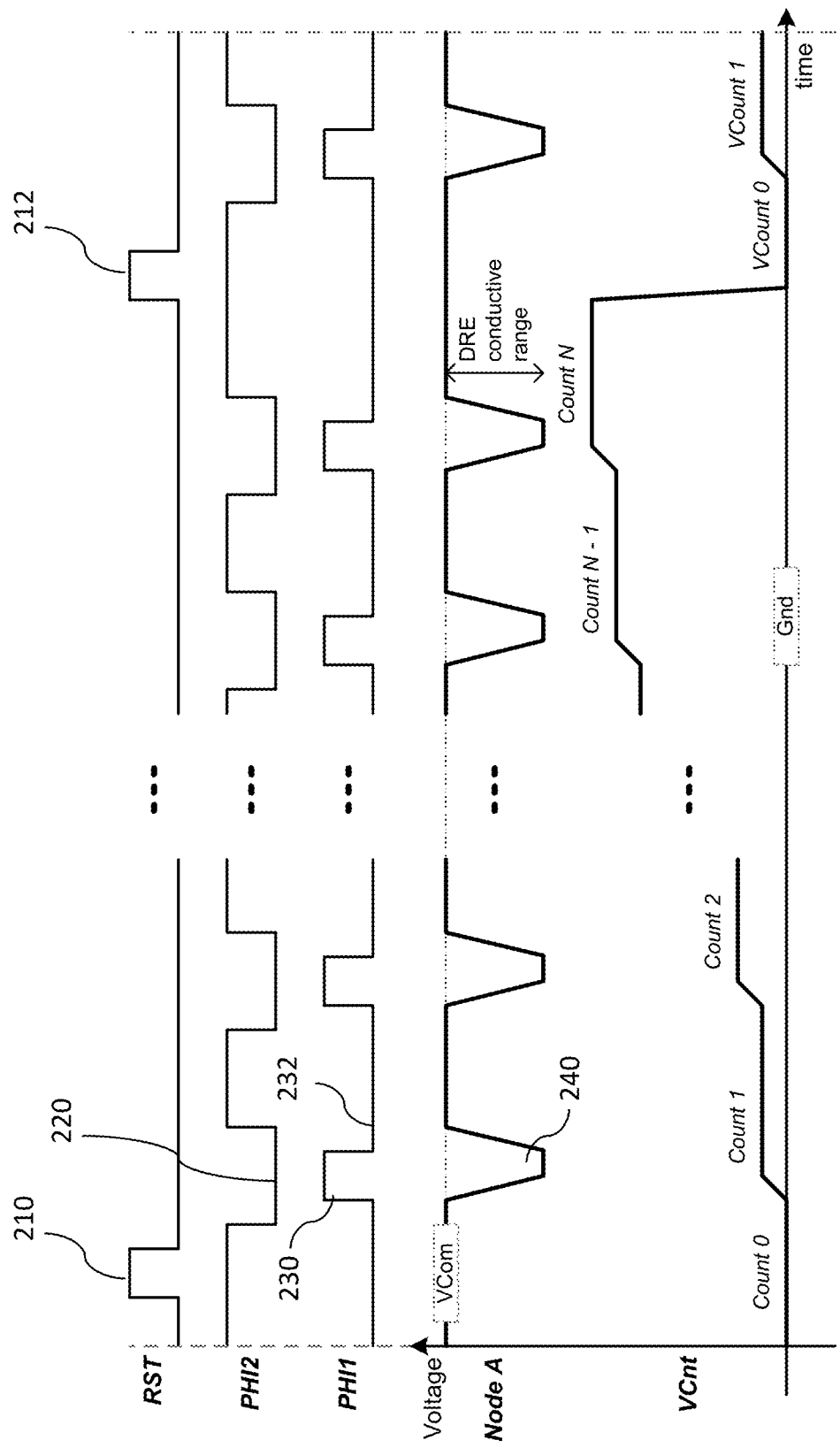
FIG. 2 illustrates voltage waveforms for operating an analog counter, in accordance with an embodiment of the present disclosure.

A charge transfer switch 130 across the charge transfer capacitor CA, driven by clock PHI2, can reset the charge on capacitor CA after every possible count in a non-overlapping manner with PHI1. This reset operation transfers charge in a closed-loop manner and reduces the supply spiking on the common supply VCom, for each count increment. A reset switch 140, driven by a reset voltage RST, can connect output voltage VCnt to a fixed voltage (e.g., the ground), so as to zero out the previous count and start a new count. In one embodiment, the clocks PHI1 and PHI2 are non-overlapping. In addition, clock PHI1 may be referred to as an input signal. In one embodiment, clock PHI2 may behave in a continuous fashion or it may be clocked along with input signal PHI1. It is appreciated that clock PHI1 must be controlled so that clock PHI2 is de-asserted when clock PHI1 is asserted. In one embodiment, the resistance of DRE 110 changes based on a difference between the voltage of common supply VCom and the voltage at node D. FIG. 2 illustrates voltage waveforms for operating an analog counter, such as the DREAC 100 of FIG. 1, in accordance with an embodiment of the present disclosure. In one embodiment, the DREAC 100 of FIG. 1 can be operated using relative voltage waveforms as shown in FIG. 2. Referring to both FIGS. 1 and 2, count clocks PHI1 and PHI2 are generated by an event to preserve the charge in the circuit and are non-overlapping. In other words, clocks PHI1 and PHI2 cannot be turned ON simultaneously. A maximum resolution of N steps is shown for illustration purposes only, where N is an integer value and can be set as described above. Although uniform counter increments are shown and described, it is appreciated that any event generating cycles of clocks PHI1 and PHI2 may be counted.

Node A is the charge transfer node and normally sits at the supply voltage VCom. The waveforms as shown in FIG. 2 assume a count-up configuration for output voltage VCnt. These internal nodes settle extremely fast, primarily due to the high bandwidth of the Dynamic Resistance Element (DRE) 110 and the fact that the charge switches between two different capacitors CA and CB are on the same reference voltage VCom. Using the same reference supply provides a closed-loop charge transfer operation that prevents the majority of supply voltage VCom spikes. As mentioned previously, the amount of charge transferred to output VCnt is the DRE conductive range multiplied by the capacitance value of CA. Consequently, the voltage change on the modulator residue at node B is the ratio of the capacitance of capacitor CA to the capacitance of capacitor CB multiplied by the DRE conductive range. FIG. 2 illustrates a ratio of CA to CB that is much less than 1.

Referring again to both FIGS. 1 and 2, initially, the DREAC 100 can be reset by sending a pulse signal 210 to reset switch 140, which brings the output voltage VCnt to the ground (or a zero reference voltage). Thereafter, charge transfer switch 130 is turned off by clock PHI2 at valley 220, and switch 120 is turned on by clock PHI1 at peak 230. As a result of switch 120 being turned on, the voltage at node A begins to drop rapidly from supply voltage VCom, until switch 120 is later turned off by clock PHI1 at valley 232. Charge transfer switch 130 is then turned on again and the voltage at node A quickly returns to supply voltage VCom, thereby forming a voltage dip 240. As a result of each voltage dip 240 at node A, charges can be transferred and stored in capacitor CB, thereby increasing output voltage VCnt by one count, e.g., Count1, Count 2, . . . , Count N. Finally, the DREAC 100 can be reset again by sending another pulse signal 212 to reset switch 140.

Figure 3:
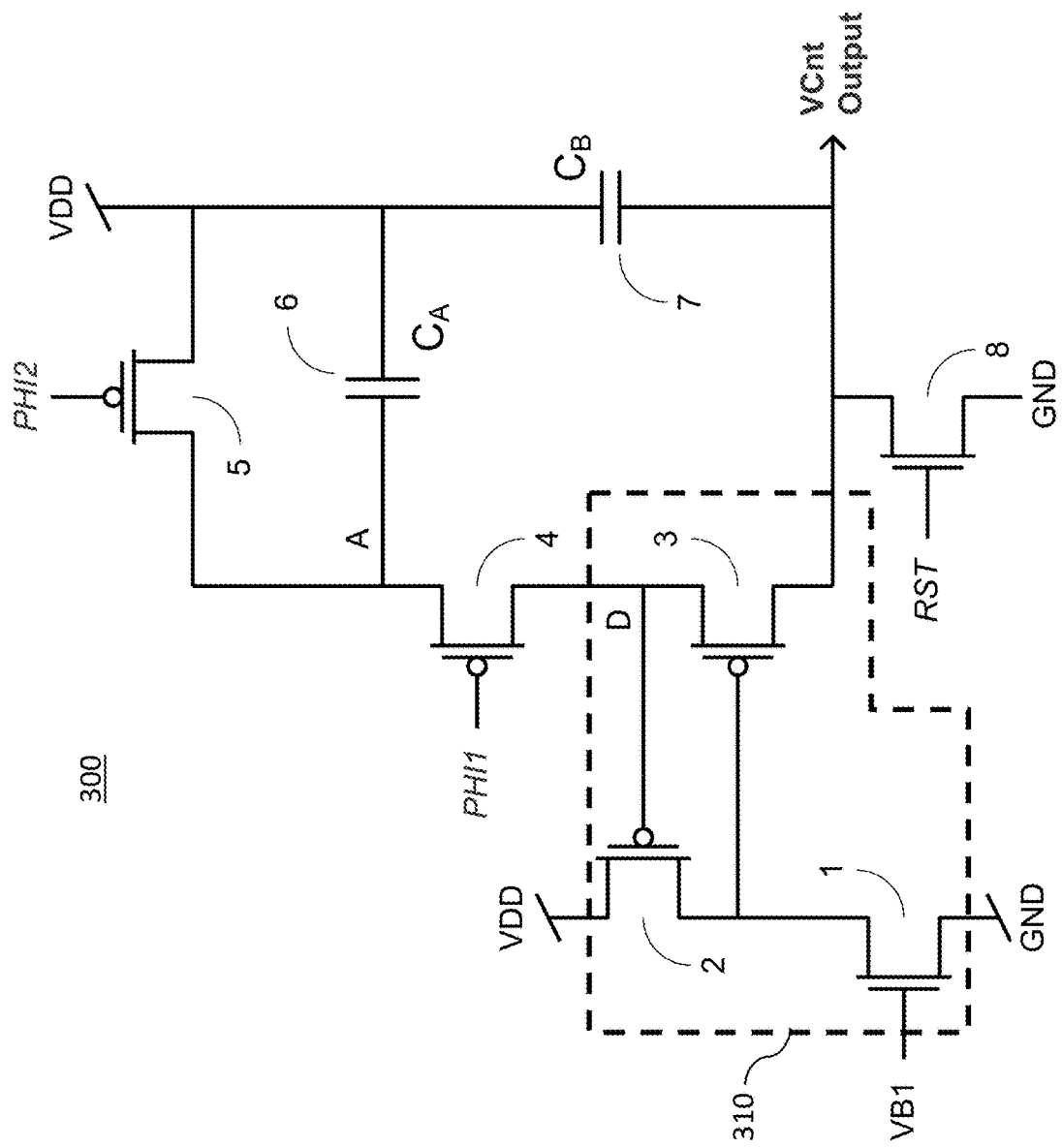
FIG. 3 illustrates a Dynamic Resistance Element Analog Counter (DREAC) implemented with MOSFETs for minimum size, in accordance with an embodiment of the present disclosure.

FIG. 3 illustrates a Dynamic Resistance Element Analog Counter (DREAC) 300 implemented with MOSFETs for minimum size, in accordance with an embodiment of the present disclosure. As shown in FIG. 3, the DREAC 300 comprises common Metal Oxide Semiconductor Field Effect Transistors (MOSFETs) configured for a count-up implementation. DREAC 300 includes a DRE 310, which comprises a gain-boosted MOSFET configuration (also referred to as a regulated cascode) with transistors 1, 2 and 3. The output resistance looking back from output voltage VCnt in the circuit is very high and is boosted by the gain of the circuit leg made up of transistors 1 and 2. Conversely, the resistance looking into the source side of transistor 3 is very low and is reduced by the gain factor from transistors 1 and 2. This is the case as long as the voltage on the source of transistor 3 is high, as will be the case immediately after node A is connected through switch transistor 4. In one embodiment, the resistance of DRE 310 changes based on a difference between the supply voltage VDD and the voltage at node D.

As node A drops to a lower voltage thereby dumping charge into the node of output voltage VCnt, transistor 3 quickly enters the subthreshold region and is driven into a very low charge transfer or almost off state. The DRE conductive range may be modified by adjusting the bias current through the gain leg of transistors 1 and 2 with voltage VB1 which, in turn, adjusts the source to gate voltage drop on transistor 2. Transistors 1 and 2 need only a small amount of bias current to provide this gain and these devices or transistors can be made very small. Additionally, voltage VB1 may be pulsed on and off to provide this bias current in conjunction with edges of clocks PHI1 and PHI2. In one embodiment, both clocks PHI1 and PHI2 are negatively asserted to turn on the p-type MOSFETs. Consequently, clock PHI2 must drop low to recharge capacitor CA between each count least-significant bit increment. Reset voltage RST is positively asserted to turn on the counter reset transistor 8 to reset the count to ground. It should be apparent to one of ordinary skill in the art that the reset potential for transistor 8 can be any voltage including zero volt or ground. In some embodiments, the DREAC 300 as shown in FIG. 3 may be cascaded in a multi-stage configuration.

In analog counters, any error in the stored count voltage will result in error in the count for high resolution counts stored on a single capacitor. This error is worse when the error is relative to other similar counters for small circuit arrayed applications. Arrayed analog counters are easy to work with if they all behave exactly the same. Unfortunately, device processing creates inherent non-uniformities in devices which will change counter characteristics from counter to counter in the array. This will further limit the maximum practical count a single analog counter can achieve without very complex element-by-element calibration algorithms. A good solution is to reduce the counts stored on any single capacitor so that each single count is represented by a voltage step large enough to be treated as ideal across a large array of elements over multiple process runs. However, large voltage steps greatly limit the count range one can store on a single capacitor to a few 10s of counts. This issue can be addressed by cascading two of these count elements in two stages, e.g., (i) a least significant bit (LSB) stage, and (ii) a most significant bit (MSB) stage, using an in-pixel comparator to decide when to reset the LSB stage and increment the MSB stage.

Figure 4:
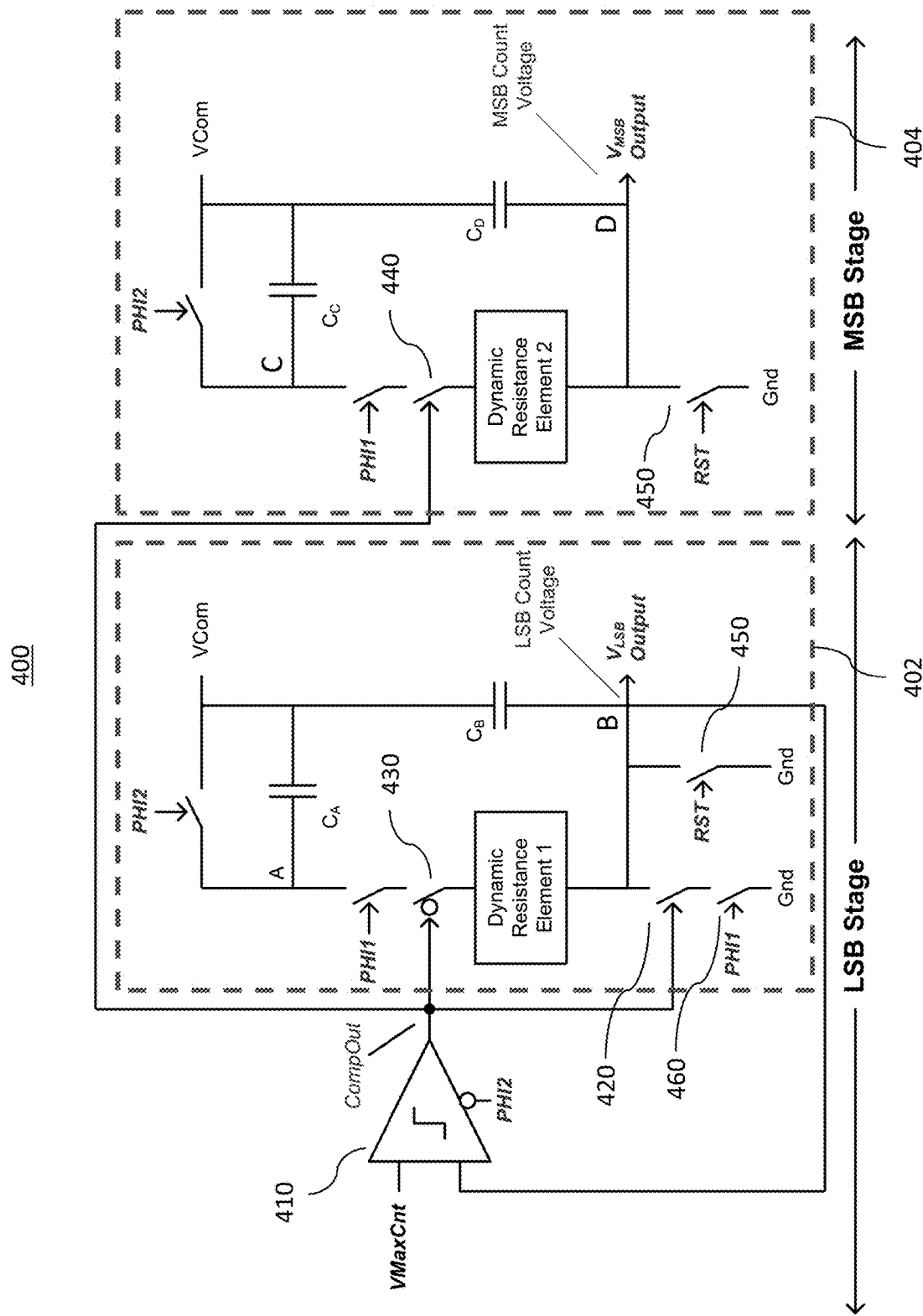
FIG. 4 illustrates a Dynamic Resistance Element Analog Counter (DREAC) with cascade operation for noiseless counts, in accordance with an embodiment of the present disclosure.

FIG. 4 illustrates a Dynamic Resistance Element Analog Counter (DREAC) 400 with multi-stage cascade operation for noiseless counts, in accordance with an embodiment of the present disclosure. In one embodiment, the count architecture is split into two stages: (i) a least significant bit (LSB) stage; and (ii) a most significant bit (MSB) stage. It appreciated that, following the same principle, one of ordinary skill in the art can construct a DREAC with three or more stages of cascade operation without departing from the spirit and scope of this claimed invention.

Referring to FIG. 4, a MSB stage analog counter 404 includes substantially the same elements as those of DREAC 100 in FIG. 1, except that MSB stage analog counter 404 additionally includes a switch 440 between input switch 120 and dynamic resistance element 110 as shown in FIG. 1. Likewise, a LSB stage analog counter 402 includes substantially the same elements as those of DREAC 100 in FIG. 1, except that LSB stage analog counter 402 additionally includes (i) a switch 430 between input switch 120 and dynamic resistance element 110, and (ii) a series of switches 420 and 460 between node B and the ground.

The LSB stage count voltage VLSB is monitored by a comparator 410. When the count voltage VLSB exceeds the comparator reference voltage (or maximum count voltage) VMaxCnt, a comparator output voltage VCompOut is generated to turn on switches 420 and 440, and to turn off switch 430. As a result, when clock PHI1 is in an on state, the MSB stage increments by one count, while the LSB stage resets to start a new LSB count. The counter resolution is then set by the number of LSB steps available in the LSB stage multiplied by the number of steps available in the MSB stage. For example, a counter resolution of 10 bits (1024 steps) may be obtained with a maximum of 32 LSB steps and 32 MSB steps. This is very important for obtaining an idealized count without noise in large arrays of counting elements, which is rather common for large neural networks or 2-D image sensing arrays.

Figure 5:
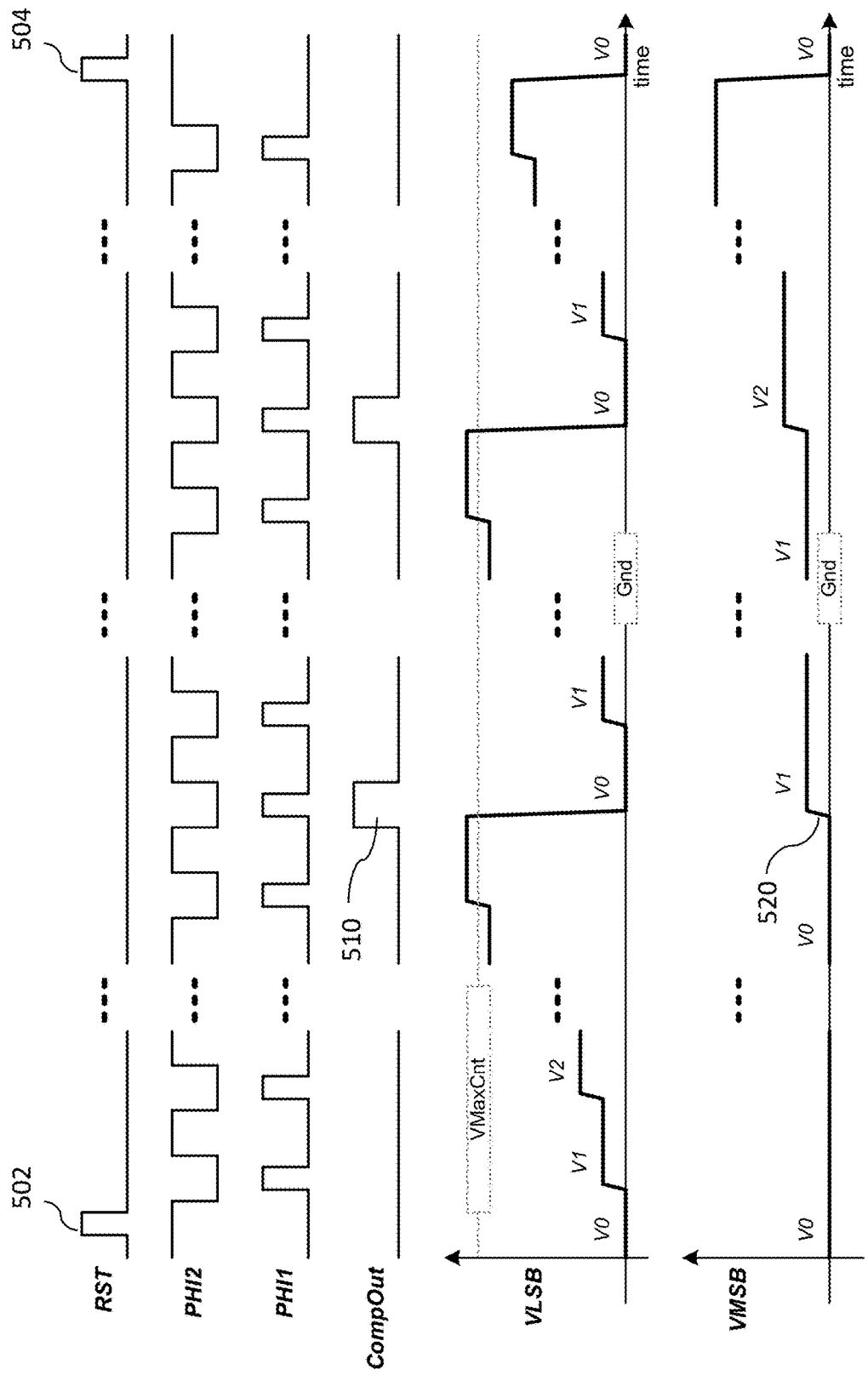
FIG. 5 illustrates voltage waveforms for operating a Dynamic Resistance Element Analog Counter (DREAC), in accordance with an embodiment of the present disclosure.

FIG. 5 illustrates voltage waveforms for operating a Dynamic Resistance Element Analog Counter, such as the multi-stage DREAC 400 of FIG. 4, in accordance with an embodiment of the present disclosure. Referring to both FIGS. 4 and 5, initially, the multi-stage DREAC 400 can be reset by sending a pulse signal 502 to switches 450, which brings the output voltages VLSB and VMSB to the ground (or a zero reference voltage). In one embodiment, the LSB stage can be operated in accordance with the same principle as shown and described above with respect to FIGS. 1 and 2. When the count voltage VLSB exceeds the comparator reference voltage VMaxCnt (namely, reaching the maximum resolution of the LSB stage), the comparator 410 then generates a pulse signal 510 as the output voltage VCompOut to reset the LSB stage and to bring the LSB stage count voltage VLSB to the ground (or a zero reference voltage). Meanwhile, the pulse signal 510 increments the MSB stage by one step 520. This can continue until the maximum resolution of the MSB stage is also reached, at which time the multi-stage DREAC 500 is reset again by sending another reset pulse voltage 504 to switches 450.

For the purposes of describing and defining the present disclosure, it is noted that terms of degree (e.g., "substantially," "slightly," "about," "comparable," etc.) may be utilized herein to represent the inherent degree of uncertainty that may be attributed to any quantitative comparison, value, measurement, or other representation. Such terms of degree may also be utilized herein to represent the degree by which a quantitative representation may vary from a stated reference (e.g., about 10% or less) without resulting in a change in the basic function of the subject matter at issue. Unless otherwise stated herein, any numerical value appearing in the present disclosure are deemed modified by a term of degree (e.g., "about"), thereby reflecting its intrinsic uncertainty.

Although various embodiments of the present disclosure have been described in detail herein, one of ordinary skill in the art would readily appreciate modifications and other embodiments without departing from the spirit and scope of the present disclosure as stated in the appended claims.

What is claimed is:

1. An analog counter, comprising:
   a dynamic resistance element having a first terminal and a second terminal electrically coupled to an output terminal, the dynamic resistance element having a variable resistance and comprising a regulated cascode;
   an input switch electrically coupled to the first terminal of the dynamic resistance element, the input switch being configured to receive an input signal;

a first capacitor electrically coupled to the input switch through a first node and directly between a supply voltage and the first node;

a charge transfer switch electrically coupled between the first node and the supply voltage;

a second capacitor electrically coupled directly between the supply voltage and the output terminal; and a reset switch electrically coupled between the second terminal of the dynamic resistance element and a ground.

2. The analog counter of claim 1, wherein the variable resistance changes in accordance with a voltage difference across the supply voltage and the first terminal.

3. The analog counter of claim 1, wherein the regulated cascode comprises a first transistor, a second transistor, and a third transistor, wherein a source of the first transistor is electrically coupled to a drain of the second transistor and a gate of the third transistor, and wherein a gate of the second transistor is electrically coupled to a source of the third transistor.

4. The analog counter of claim 3, wherein a conductive range of the dynamic resistance element is determined in accordance with a voltage applied to a gate of the first transistor.

5. The analog counter of claim 3, wherein a drain of the third transistor is electrically coupled to the output terminal.

6. The analog counter of claim 3, wherein a source of the second transistor is electrically coupled to the supply voltage.

7. The analog counter of claim 1, wherein at least one of the first and second capacitors is a parasitic capacitor.

8. A readout circuit for processing input signals from an array of image sensing pixels, the readout circuit comprising the analog counter of claim 1.

9. A multi-stage analog counter, comprising:
a first stage analog counter comprising a first dynamic resistance element, a first switch coupled to a first terminal of the first dynamic resistance element, and a first reset switch coupled between a second terminal of the first dynamic resistance element and a ground, the second terminal being coupled to a first output terminal, wherein the first dynamic resistance element comprises a regulated cascode;
a second stage analog counter comprising a second dynamic resistance element and a second switch coupled to a first terminal of the second dynamic resistance element, wherein a second terminal of the second dynamic resistance element is coupled to a second output terminal, wherein the second dynamic resistance element comprises a regulated cascode; and
a comparator configured to compare a first output voltage directly from the first stage analog counter with a reference voltage;
wherein, when the first output voltage reaches the reference voltage, the comparator is configured to generate a second output voltage to turn on the first reset switch of the first stage analog counter and the second switch of the second stage analog counter, and to turn off the first switch of the first stage analog counter, such that the second stage analog counter increments by one count and the first stage analog counter is reset.

10. The multi-stage analog counter of claim 9, wherein the first stage analog counter further comprises:
a first input switch electrically coupled to the first switch, the first input switch being configured to receive an input signal;
a first capacitor electrically coupled to the input switch through a first node and between a supply voltage and the first node;
a charge transfer switch electrically coupled between the first node and the supply voltage;
a second capacitor electrically coupled between the supply voltage and the first output terminal; and
a first stage reset switch electrically coupled between the second terminal of the dynamic resistance element and a ground.

11. The multi-stage analog counter of claim 10, wherein the first dynamic resistance element has a variable resistance that changes in accordance with a voltage difference across the supply voltage and the first terminal of the first dynamic resistance element.

12. The multi-stage analog counter of claim 9, wherein the second stage analog counter further comprises:
a second input switch electrically coupled to the second switch, the second input switch being configured to receive an input signal;
a third capacitor electrically coupled to the second input switch through a third node and between a supply voltage and the third node;
a charge transfer switch electrically coupled between the third node and the supply voltage;
a fourth capacitor electrically coupled between the supply voltage and the second output terminal; and
a second stage reset switch electrically coupled between the second terminal of the dynamic resistance element and a ground.

13. The multi-stage analog counter of claim 12, wherein the second dynamic resistance element has a variable resistance that changes in accordance with a voltage difference across the supply voltage and the first terminal of the second dynamic resistance element.

14. A readout circuit for processing input signals from an array of image sensing pixels, the readout circuit comprising the multi-stage analog counter of claim 9.

15. The analog counter of claim 1, wherein a counter resolution of the analog counter is set by a capacitance ratio of the first capacitor and the second capacitor.

16. The analog counter of claim 15, wherein the counter resolution increases as the capacitance ratio decreases.

17. The analog counter of claim 10, wherein a counter resolution of the first stage analog counter is set by a capacitance ratio of the first capacitor and the second capacitor.

18. The analog counter of claim 12, wherein a counter resolution of the second stage analog counter is set by a capacitance ratio of the third capacitor and the fourth capacitor.

* * * * *